United States Patent [19]

Bregman et al.

[11] Patent Number: 5,006,925
[45] Date of Patent: Apr. 9, 1991

[54] THREE DIMENSIONAL MICROELECTRIC PACKAGING

[75] Inventors: Mark F. Bregman, Ridgefield, Conn.; Raymond R. Horton, Dover Plains, N.Y.; Ismail C. Noyan, Peekskill, N.Y.; Michael J. Palmer, Walden, N.Y.

[73] Assignee: International Business Machines Corporation, Armonk, N.Y.

[21] Appl. No.: 440,180

[22] Filed: Nov. 22, 1989

[51] Int. Cl.[5] .................. H01L 23/16; H01L 23/44; H05K 7/14
[52] U.S. Cl. ............................. 357/82; 357/80; 357/75; 361/381; 361/382; 361/385
[58] Field of Search .................. 357/81, 82, 75; 361/414, 412

[56] References Cited

U.S. PATENT DOCUMENTS

| 4,468,717 | 8/1984 | Mathias et al. | 357/82 |
| 4,571,663 | 2/1986 | McPherson | 361/393 |
| 4,590,538 | 5/1986 | Cray, Jr. | 361/382 |
| 4,694,378 | 9/1987 | Nakayama et al. | 357/82 |
| 4,763,298 | 8/1988 | Hoelzel et al. | 361/381 |
| 4,855,809 | 8/1989 | Malhi et al. | 357/74 |
| 4,868,712 | 9/1989 | Woodman | 361/414 |
| 4,880,053 | 11/1989 | Sheyman | 361/385 |
| 4,891,688 | 1/1990 | Longerich | 357/82 |
| 4,893,174 | 1/1990 | Yamada | 357/82 |
| 4,912,600 | 3/1990 | Jaeger et al. | 357/82 |
| 4,922,378 | 5/1990 | Malhi et al. | 357/75 |

FOREIGN PATENT DOCUMENTS

| 54-38771 | 3/1979 | Japan | 357/81 C |
| 59-163844 | 9/1984 | Japan | 357/82 |
| 59-227147 | 12/1984 | Japan | 357/75 |
| 60-39855 | 3/1985 | Japan | 357/82 |
| 62-260352 | 11/1987 | Japan | 357/75 |

Primary Examiner—Andrew J. James
Assistant Examiner—Viet Q. Nguyen
Attorney, Agent, or Firm—Joseph J. Kaliko; Daniel P. Morris

[57] ABSTRACT

A three dimensional chip package comprising a plurality of semiconductor substrates, each having at least one semiconductor electronic device mounted thereon; wherein at least a subset of said plurality substrates are physically joined to form an enclosure within which each substrate has at least one electrical contact location to another substrate; and further wherein at least one cooling channel is provided within said enclosure into which a cooling fluid may be introduced.

9 Claims, 4 Drawing Sheets

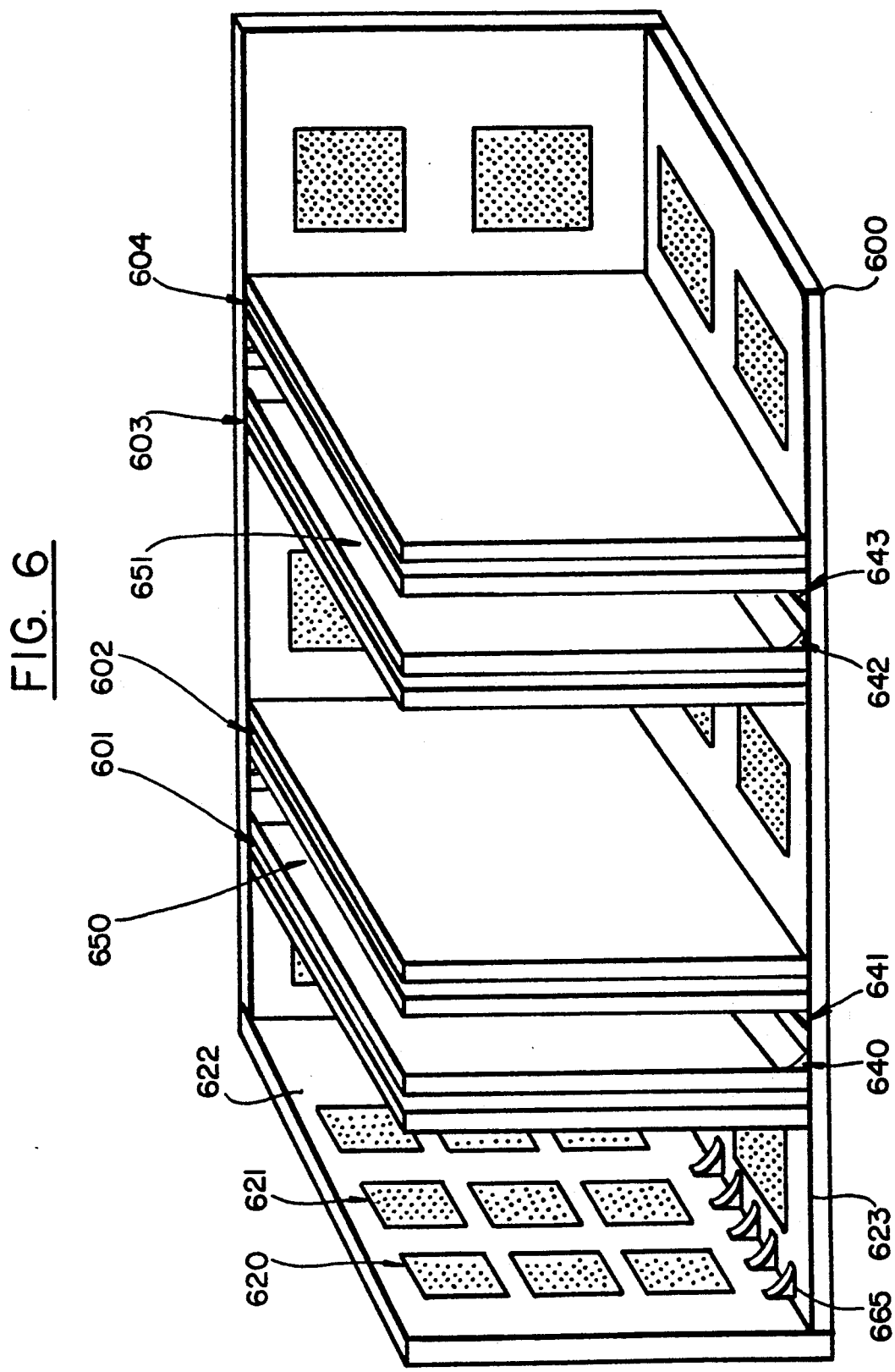

THREE DIMENSIONAL MICROELECTRIC PACKAGING

BACKGROUND OF THE INVENTION

1. Field of the Invention

The invention relates generally to packaging techniques for integrated circuit devices. More particularly, the invention relates to three dimensional chip packages and packaging techniques which achieve both high volumetric packaging and high cooling efficiency to enhance the performance of a packaged system.

2. Brief Description of the Related Art

Packaging is increasingly the limiting factor in achieving maximum performance from Very Large Scale Integrated (VLSI) based computer systems. The limitations due to packaging arise from two major physical constraints; the maximum power density that can be cooled and the signal transit delay introduced by the package.

Conventional packages fall into two primary categories; two dimensional packages such as planar based systems and three dimensional packages such as card-on-board packages.

The planar type package is used in high end systems to allow for maximum cooling efficiency. In order to increase circuit density in planar packages (and thereby minimize signal transit delay), semiconductor manufacturers have continued to reduce the size of various integrated circuit elements and interconnections to the point where the limits of current technology are being reached.

In order to increase circuit density and gain other manufacturing advantages, various methods have been explored to interconnect a plurality of integrated circuit chips using horizontal and vertical stacking techniques and three dimensional interconnect modules which increase integrated circuit surface are by factors of 2, 3, 4 or more.

Prior art three dimensional packaging schemes are typified by the teachings of Golubic in U.S. Pat. No. 4,801,992, by Higgins, III in U.S. Pat. No. 4,727,410, and by Brown et al in both U.S. Pat. Nos. 4,502,098 and 4,823,233. These three dimensional type packages are used in mid-range systems to gain maximum packaging density and enhance sYstem performance. However, none of these patents or other teachings in the prior art, provide a three dimensional chip package that combines enhanced packaging density with high cooling efficiency.

In fact, the need for cooling efficiency increases as circuit density increases. If not addressed, the lack of proper cooling capacity can have a serious adverse effect on system performance for densely packaged systems.

Accordingly, it would be desirable to have an integrated circuit package which can be efficiently cooled and accommodate high volumetric packaging. The resulting package would be particularly useful in enhancing the system level performance for VLSI computer processors, among other devices.

SUMMARY OF THE INVENTION

It is a principal object of the invention to provide a three dimensional chip package which enhances the performance of a packaged system, by facilitating both high volumetric packaging and high cooling efficiency.

It is a particular object of the invention to enhance the performance of VSLI based computer systems packaged according to the teachings of the invention.

It is further object of the invention to provide a three dimensional chip package and associated packaging techniques which allow for high bandwidth communication between packaged processor and memory elements.

It is still further object of the invention to provide a three dimensional chip package and associated packaging techniques in which cooling channels are provided for the introduction of a liquid or gaseous coolant to improve cooling efficiency.

Further yet, it is an object of the invention is to provide a three dimensional chip package and packaging techniques which inherently accommodate a large number of signal and power interconnects between packaged components and which allow the introduction of signals and power from outside the package.

Yet another object of the invention to provide methods for fabricating three dimensional chip packages which accommodate high volumetric packaging while at the same time providing for a high level of cooling efficiency.

According to a preferred embodiment of the invention, the package is comprised of a plurality of semiconductor substrates, each having at least one semiconductor electronic device mounted thereon; means for physically joining at least a subset of said plurality substrates to form an enclosure within which each substrate has at least one electrical contact location to another substrate; and means for providing at least one cooling channel within said enclosure into which a cooling fluid may be introduced.

The channels can be sealed by hermetic seals formed from solder and the electrical interconnections between subtrates can be formed by solder filets which electrically interconnect pads on the substrate edges.

The invention features means inherent in the package structure (the channels, means for introducing coolants, etc.) for cooling a system having a very high volumetric power density.

The invention also features a three dimenstional packaging scheme which facilitates the laying out of processors and shared memory elements in a symetric manner to allow each processor to have equal access (in terms of physical proximity and signal transit time) to memory.

These and other objects and features of the present invention and the manner of obtaining them will become apparent to those skilled in the art, and &he invention itself will be best understood bY reference to the following detailed description read in conjunction with the accompanying Drawing.

BRIEF DESCRIPTION OF THE DRAWING

FIG. 6 depicts a package constructed in accordance with the teachings of the invention, where the package is comprised of the "face-to-face" carriers depicted in FIG. 5.

DETAILED DESCRIPTION

According to an illustrative embodiment of the invention, a chip package comprises a plurality of multichip carriers with logic and memory devices attached to the surface and containing wiring to interconnect the devices.

Figure 1:
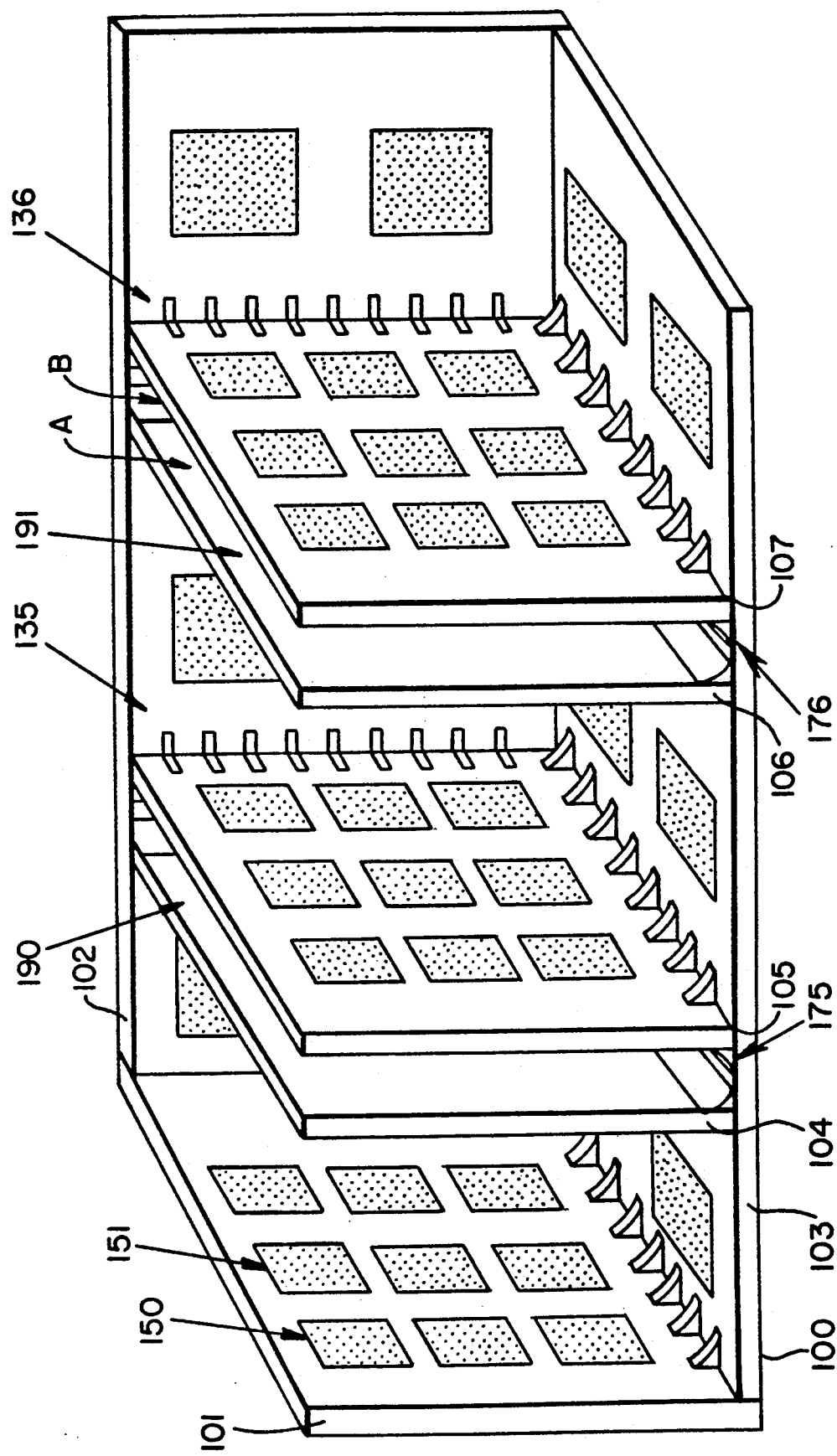
FIG. 1 depicts a three dimensional chip package constructed in accordance with the teaching of the invention.

Reference is made to FIG. 1 which depicts a number of these planer carriers joined in "shoe box" type assembly, assembly 100, with a large number of signal and power interconnects shown between the various sides of the box.

In particular, FIG. 1 depicts portions of seven chip carriers (101-107), with chips (such as chips 150 and 151) attached to certain faces of the carriers. For example, chips 150 and 151 are shown attached to one face of carrier 101. Certain opposing faces of the carriers, for example face "A" of carrier 106 and face "B" (hidden) of carrier 107, are devoid of chips and form the wall of channels between pairs of carriers. For example, FIG. 1 depicts channel 190, between carriers 104 and 105, and channel 191, between carrier 106 and 107.

The aforementioned signal and power interconnections between carriers are illustrated in FIG. 1 by connections 135 and 136. These connections allow high bandwidth communications between processor elements and memory. Signals and power from outside assembly 100 can be introduced through connections at the ends of the box (not shown).

According to the preferred embodiment of the invention, coolant can be introduced into channels 190 and 191 to efficiently cool assembly 100. FIG. 1 also depicts hermetic seals 175 and 176 which assure that the coolant (liquid or gas) remains in the depicted cooling channels.

The planar carriers shown in FIG. 1 can be constructed using silicon based thin film packaging technology as is well known to those skilled in the art. The individual carriers can be joined using solder.

According to a preferred method of fabricating the package depicted in FIG. 1, individual pads are coated with solder, prior to fixturing the carriers in their final position, to provide for the signal and power interconnections. The pads can then be joined to their mates in a mass reflow operation during which the solder on mating pads coalesces to form a filet. This process is illustrated in FIG. 2 which depicts a preferred way in which to provide the aforementioned signal and power interconnections between carrier pairs.

Figure 2:
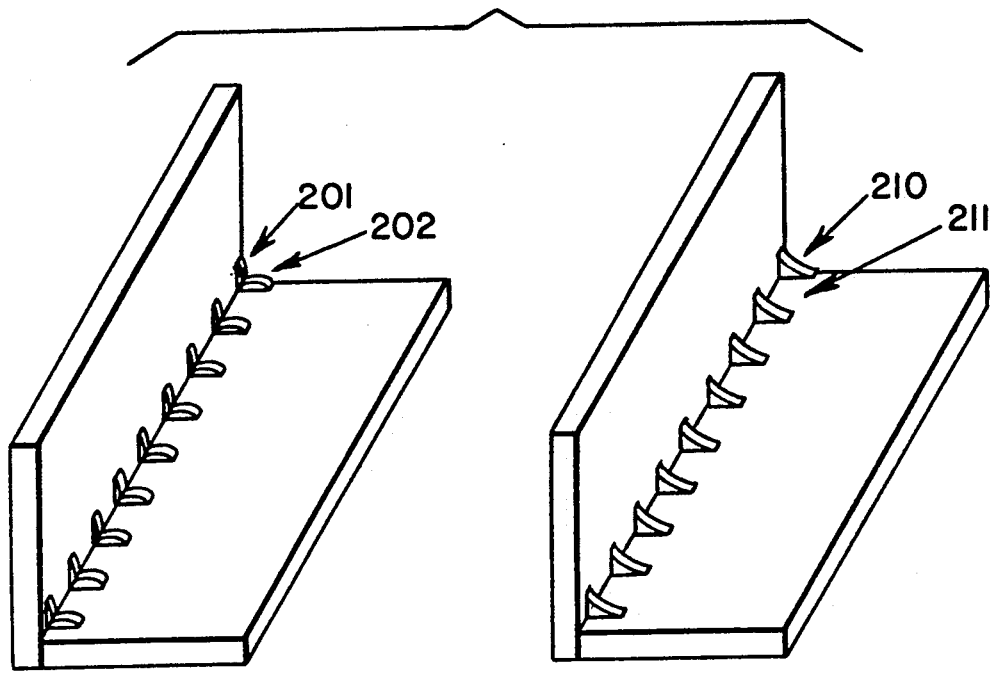
FIG. 2 depicts how to provide signal and power interconnections between pairs of the silicon carriers depicted in FIG. 1.

In particular, FIG. 2 shows solder on individual pairs of pads, e.g., 201 and 202, before reflow, and a set of solder filets, like filets 210 and 211, that result from the solder coalescing after reflow.

Figure 3:
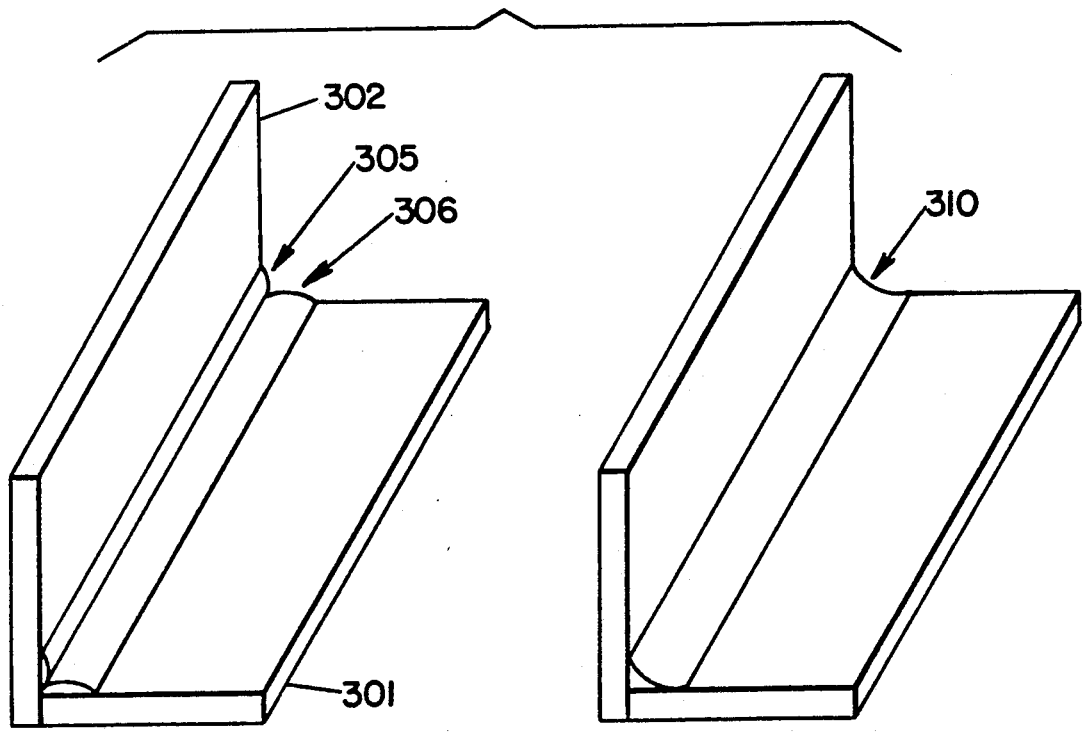
FIG. 3 depicts how to provide a hermetic seal for the cooling channels of the package in FIG. 1.

Reference is made to FIG. 3 which illustrates a preferred way in which to provide a hermetic seal for the cooling channels depicted in FIG. 1. To provide such a seal a single pad can be provided on the back of carriers 301 and 302, which is coated with solder and mates to a matching long pad on the carrier to which the primary carrier is mated. The solder coated pads are shown as elements 305 and 306 in FIG. 3

During the same mass solder reflow process mentioned hereinbefore, the solder on the long pads coalesces to form a hermetic seal between the two joined carriers. The result of this joining and sealing process is continuous solder filet 310, also depicted in FIG. 3.

As indicated hereinbefore, the channel between adjacent and opposite facing carriers, which are devoid of chips, can be used for cooling by providing a method for introducing and removing cooling liquid to/from the cooling channels. One method and carrier assembly for performing this function is illustrated in FIG. 4.

Figure 4:
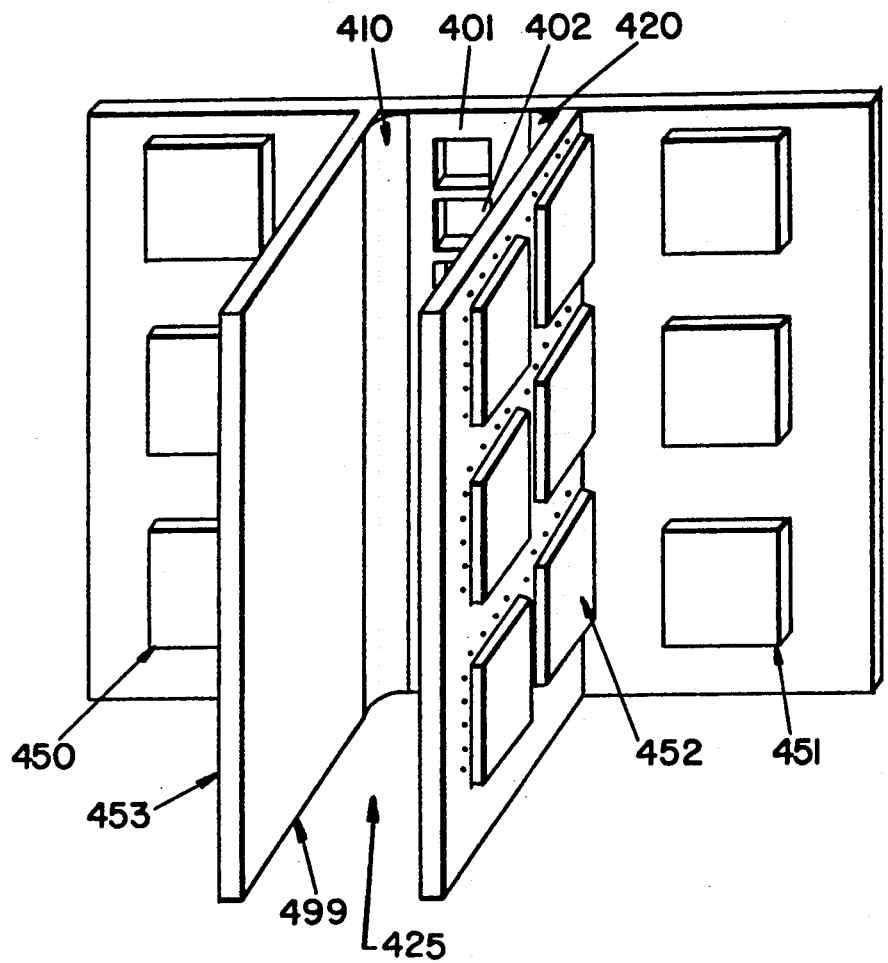
FIG. 4 depicts how coolant can be introduced into and removed from a channel between adjacent and opposite facing carriers via holes through the surrounding carriers that coincide with the gap between the carriers to be cooled.

FIG. 4 depicts how coolant can be introduced into and removed from a channel between adjacent and opposite facing carriers via holes through the surrounding carriers that coincide with the gap between the carriers to be cooled. As shown in FIG. 4, coolant can be introduced through the holes on one side of the "shoe box" assembly and can be removed through holes on the opposite side of the assembly. These holes, shown for example as apertures 401 and 402 in FIG. 4, can be fabricated when fabricating the carriers themselves by using anisotropic etching or electrodischarge machining.

The use of the aforementioned silicon based thin film packaging technology for forming the carriers is preferred because it allows for the formation of fine grooves on the backside of the carriers which can improve thermal transfer to the cooling liquid in the channels.

FIG. 4 also depicts an example of a suitable spatial relationship, in the context of the illustrative embodiment of the invention being described, between etched apertures (e.g., apertures 401 and 402), hermetic solder filets (e.g., filets 410 and 420), the chips mounted in the package (e.g., C4 chips 450–452 which are visible, and chip 453 which is hidden from view), and coolant channel 499, shown, for the sake of illustration only, to be carrying coolant in the direction indicated by arrow 425.

An alternate embodiment of a three dimensional package and packaging concept contemplated by the invention comprises pairs of carriers facing one another, connected to each other at various points throughout their area using, for example, large C4 type solder interconnections, as well as being connected to other carriers at their edges. A suitable arrangement which has the chip carrying faces of the carriers facing one another is depicted in FIG. 5.

Figure 5:
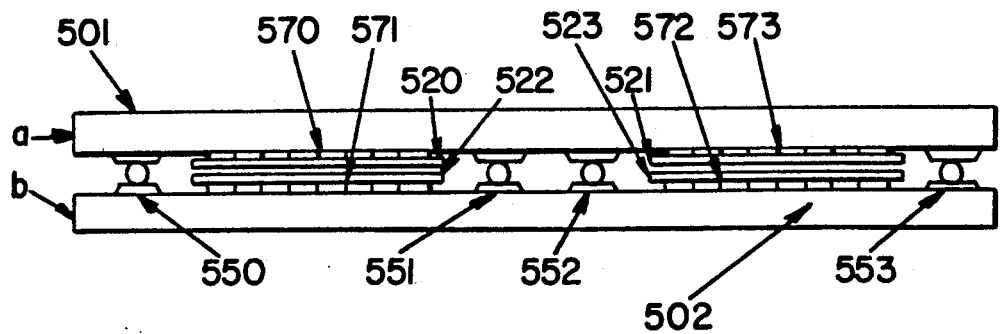
FIG. 5 depicts an embodiment of the invention in which two carriers facing each other are interconnected at various points using large C4 type solder interconnections.

According to the illustrative embodiment of the invention shown in FIG. 5, chip carriers 501 and 502 have their chip carrying faces, shown as "a" and "b" respectively, interconnected using Macro C4 connections 550–553. Chips 520 and 521, on carrier 501, and chips 522 and 523, on carrier 502, are shown mounted to their respective carriers using standard C4 connections at reference numerals 570–573.

An arrangement for connecting pairs of carriers like those depicted in FIG. 5 to form a three dimensional package of the type contemplated by the invention, is depicted in FIG. 6.

In FIG. 6 it can be seen that four planar "face-to-face" carriers (actually pairs of carriers), 601–604, are arranged in a "shoe box" type assembly, assembly 600, with cooling channels 620 and 621 being fabricated between face-to-face carrier pairs 601 and 602, and pairs 603 and 604.

Other chips are shown on the face of carriers that are not of the face-to-face type. For example, chips 620 and 621 are shown on carrier 622, and solder filets, like filet 665, are shown for interconnecting pairs of carriers, like 622 and 623. The filets can be created as described hereinbefore with reference to FIGs. 1 and 2.

FIG. 6 also depicts hermetic seals 640-643, which, as described hereinbefore with reference to FIG. 3, seal depicted channels 650 and 651 to keep any coolant introduced into these channels, within the channels.

It should be noted with reference to both FIGS. 5 and 6 that when using face-to-face type carriers, the carrier not contacting the coolant directly is cooled by conduction through the large number of C4 like interconnections between itself and the carrier that is in contact with the coolant.

The above described invention will yield high performance for systems where a single processor element can be contained within a single carrier. In this case the additional carriers can be used to provide memory or additional processor elements. As indicated hereinbefore, one particular embodiment of the invention contemplated would have the internal carriers contain memory that could be shared by a number of processing elements. Using this packaging structure would allow each processor to have equal access to memory due to the spatial symmetry of the package.

For systems that cannot be contained on a single carrier the packages contemplated by the invention provide miminal path delay from carrier to carrier thus improving system performance.

As those skilled in the art will readily appreciate the above described packages and techniques provide means to cool a system having a very high volumetric power density.

What has been described are packages and packaging techniques, meeting all of the objectives set forth hereinbefore. Those skilled in the art will recognize that the foregoing description of novel packages and packaging techniques have been presented for the purposes of illustration and description only. It is not intended to be exhaustive or to limit the invention to the precise form disclosed, and obviously many modifications and variations are possible in light of the above teaching.

For example, certain applications, like those employing cryogenic switches or storage devices, may require that the packaged circuits be immersed in a coolant. In such applications circuit devices may actually be mounted within the cooling channels, formed in accordance with the teachings set forth hereinabove, without departing from the scope or spirit of the invention.

The embodiments and examples set forth herein were presented in order to best explain the principles of the instant invention and its practical application to thereby enable other skilled in the art to best utilize the instant invention in various embodiments and with various modifications as are suited to the particular use contemplated.

What is claimed is:

1. A three-dimensional chip package comprising:
   (a) A plurality of semiconductor substrates, each having at least one semiconductor electronic device mounted thereon, wherein at least a subset of said plurality of semiconductor substrates are joined together to form an enclosure for housing the mounted semiconductor electronic devices;
   (b)) means for forming an electrical contact between at least two of said plurality of substrates; and
   (c) channel means, for providing at least one cooling channel within said enclosure into which a cooling fluid may be introduced, wherein at least a part of said at least one cooling channel is formed by positioning at least two semiconductor substrate surfaces to form channel walls.

2. A three-dimensional chip package as set forth in claim 1 further comprising a hermetic seal for each cooling channel.

3. A three-dimensional chip package as set forth in claim 2 wherein each hermetic seal is formed from solder.

4. A three dimensional chip package as set forth in claim 1 wherein said electrical contact is formed by a solder fillet which interconnects pads on adjacent substrate edges.

5. A three dimensional chip package as set forth in claim 4 wherein said at least one cooling channel is formed by a plurality of substrate surfaces not having any semiconductor electronic devices mounted thereon.

6. A three dimensional chip package as set forth in claim 1 wherein said electrical contact is formed by a solder connection between opposing substrate surfaces both of which have at least one of said semiconductor devices mounted thereon.

7. A three dimensional chip package as set forth in claim 5 wherein said at least one cooling channel is formed by a plurality of substrate surfaces not having any semiconductor electronic devices mounted thereon.

8. A three dimensional chip package as set forth in claim 6 wherein said channel means further comprises means for introducing and removing fluid to and from said at least one cooling channels.

9. A three dimensional chip package as set forth in claim 7 wherein said means for introducing and removing cooling fluid forms a part of said enclosure and includes apertures through which the fluid may be introduced and removed.

* * * * *